United States Patent [19]

Sakai et al.

[11] Patent Number: 4,956,662
[45] Date of Patent: Sep. 11, 1990

[54] APPARATUS FOR AND METHOD OF RECORDING COLOR PICTURE IMAGE

[75] Inventors: Toshio Sakai; Osamu Kawano; Kazunori Tanabe; Tomoaki Hattori, all of Nagoya, Japan

[73] Assignee: Brother Kogyo Kabushiki Kaisha, Japan

[21] Appl. No.: 255,342

[22] Filed: Oct. 11, 1988

[30] Foreign Application Priority Data

| Oct. 9, 1987 | [JP] | Japan | 62-256000 |
| Mar. 10, 1988 | [JP] | Japan | 63-32109[U] |
| Mar. 16, 1988 | [JP] | Japan | 63-62810 |
| Apr. 22, 1988 | [JP] | Japan | 63-100913 |

[51] Int. Cl.$^5$ .............................................. G03B 27/32
[52] U.S. Cl. .................................... 355/27; 355/32; 355/75; 355/317
[58] Field of Search ...................... 355/27, 28, 32, 75, 355/308, 317

[56] References Cited

U.S. PATENT DOCUMENTS 4,875,074 10/1989 Sangyoji et al. ................... 355/27

Primary Examiner—Michael L. Gellner
Assistant Examiner—Khanh Dang
Attorney, Agent, or Firm—Oliff & Berridge

[57] ABSTRACT

In forming a color picture image on a photosensitive recording medium by exposing through a masking master plate, the plate is conveyed by a conveyor belt into an exposure device where the plate must be registered in a specified position to avoid a color shift in the image formed on the photosensitive recording medium. A positional error or deviation of the plate is detected by reading out a location mark on the plate by a plurality of sensors. According to the outputs from the sensors, the conveyor belt is moved in a longitudinal path by one or two motors to correct a longitudinal deviation, and two longitudinally spaced portions of a belt support unit are moved, in a direction perpendicular to the longitudinal path, independently and respectively by other two motors to correct a transverse deviation and/or a skew.

21 Claims, 6 Drawing Sheets

APPARATUS FOR AND METHOD OF RECORDING COLOR PICTURE IMAGE

BACKGROUND OF THE INVENTION

The present invention relates to an apparatus for and a method of recording a color picture image by using three masking master plates.

A typical color picture image recording apparatus of the described type has been proposed heretofore. In this proposed apparatus, a masking master plate corresponding to a respective one of three primary colors outputted from a monochromatic printer is brought in contact with a photosensitive pressure-sensitive recording medium, whereupon the latter is exposed to light through the masking master plate to form a color latent image on the photosensitive pressure-sensitive recording medium. Subsequently a developer sheet is placed on the photosensitive pressure-sensitive recording medium and is then pressed thereagainst by a pressure developing unit. As a result, a color picture image is formed on the developer sheet.

However, from this proposed apparatus it was found no practical manner in which each of the three masking master plate is registered at the same position on the photosensitive pressure-sensitive recording medium. To this end. assuming that a conventional locating technique is used tentatively in this proposed apparatus, the individual masking master plate is temporarily stopped by a pair of locating rollers at an upstream end of a conveyor in such a manner that a leading edge of the plate is aligned in a direction parallel to the axes of the locating rollers. Then the aligned masking master plate is fed bY the conveyor. Finally, when the leading edge of the masking master plate or a location mark on the masking master plate arrives at a sensor disposed in a travelling path of the plate, the sensor issues a termination signal to deenergize a drive for the conveyor to thereby discontinue the feeding of the plate. Practically, however, this conventional locating technique is not suitable for the color picture image recording apparatus of the type discussed above, because every masking master plate has a picture image not necessarily at the same position and, as a result, a shift or shear between three primary colors would occur in forming a color latent image on the photosensitive pressure-sensitive recording medium, thus deteriorating the quality of a color image formed on the developer sheet.

SUMMARY OF THE INVENTION

It is therefore an object of the present invention to provide an apparatus for and a method of recording a good quality color picture image, with no color shift between three primary colors, by locating three masking master plates one at a time precisely on a photosensitive pressure-sensitive recording medium.

Another object of the invention is to provide a color picture image recording apparatus in which the individual marks on the respective masking master plates can be read out with improved accuracy, irrespective of the density or opaqueness of the mark, thus guaranteeing a good quality picture image with no color shift.

A further object of the invention is to provide a color picture image recording apparatus which is simple in construction and hence inexpensive to manufacture.

According to a first aspect of the present invention, there is provided a color picture image recording apparatus for forming a color picture image on a photosensitive recording medium by exposing the photosensitive recording medium to light through each of three masking master plates produced according to original color picture image information, each of the masking mater plates having a location mark, the apparatus comprising: a housing; a conveyor belt disposed in the housing and defining a flat surface for carrying thereon one of the masking master plates at a time, the flat surface having a downstream and an upper end; a belt support unit mounted in the housing and supporting the conveyor belt, the belt support unit being movable relative to the housing and having a pair of downstream and upstream portions; first drive means for moving the conveyor belt in a longitudinal direction; second and third drive means operatively connected to the belt support unit at the downstream and upstream portions, each of the second and third drive means being independently operable for moving a respectively one of the downstream and upstream portions in a plane parallel to the flat surface of substantially perpendicular to the longitudinal direction; a plurality of sensors disposed above the flat surface of the conveyor belt for reading out the location mark on the masking master plate carried on the flat surface of the conveyor belt and for issuing respective output signals; and control means for controlling the first, second, third and fourth drive means according to the output signals from the sensors.

According to a second aspect of the invention, there is provided a method of forming a color picture image on a photosensitive recording medium by exposing the photosensitive recording medium to light through each of three masking master plates produced according to original color picture image information, the method comprising the steps of: providing each of the masking master plates with a location mark; moving a conveyor belt in a longitudinal direction, the conveyor belt defining a flat surface for carrying thereon one of the masking master plates at a time, the flat surface having an upstream and a downstream end, the conveyor belt being supported by a belt support unit having a pair of downstream and upstream portions; reading out the location mark on the individual masking master plate by a plurality of sensors operable to issue output signals; and according to the output signals of the sensors, moving the conveyor belt in a longitudinal direction also and moving independently the upstream and downstream portions of the belt support unit in a plane parallel to the flat surface of the conveyor belt and in a transverse direction substantially perpendicular to the longitudinal direction.

Many other advantages, features and additional objects of the present invention will become manifest to those skilled in the art upon making reference to the detailed description and the accompanying drawings in which certain embodiments incorporating the principles of the present invention are shown by way of illustrative example.

DETAILED DESCRIPTION OF THE PREFERRED EMBODIMENTS

Figure 1:
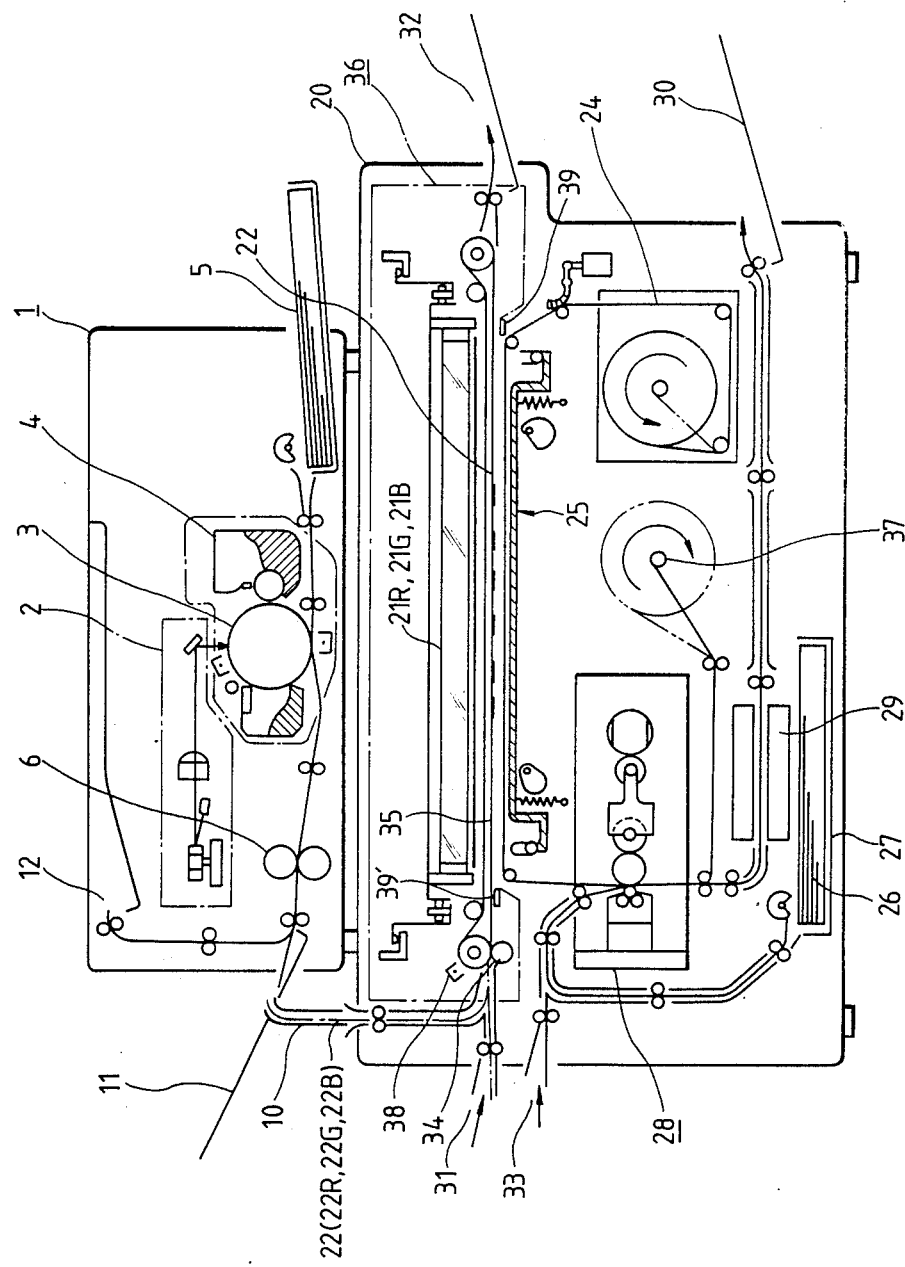
FIG. 1 is a vertical cross-sectional view of a color picture image recording apparatus embodying the present invention, the apparatus being coupled with a monochromatic printer.

The principles of the present invention are particularly useful when embodied in a color picture image recording apparatus such as shown in FIG. generally designated by reference numeral 20.

The apparatus 20 is operatively joined with a monochromatic printer. In the illustrative embodiment, the monochromatic printer is a laser printer I in which a polygon scanner 2 applies laser light over a precharged photosensitive drum 3 to form an electrostatic latent image thereon. The photo-sensitive drum 3 is then developed by a developing device 4, whereupon the toner image on the photosensitive drum 3 is transferred onto a plain paper, or an OHP sheet, supplied from a sheet cassette 5 and is then fixed to the paper by an image fixing device 6. Usually, the laser printer 1 records data transmitted from a non-illustrated host computer. In the meantime the apparatus 20 records a picture image bY using three masking master plates produced according to original color picture image information. When it is necessary to output a usual monochromatic picture image, a sheet or paper on which a monochromatic picture image outputted from the laser printer 1 is fixed, is fed to a discharge tray 11 or another discharge traY 12.

The apparatus 20 generally comprises a path change-over unit 10 for changing one paper path to another in order to feed three masking master plates 22R, 22G, 22B (hereinafter referred to as "intermediate sheets 22") one at a time from the laser printer 1 to an exposure unit 36, a transparent conveyor belt 35 for carrying and conveying the individual intermediate sheet 22, a static electricity generator 38 for rendering the intermediate sheet 22 to be electrostatically attracted or stuck to the conveyor belt 35, an exposure stand 25 on which the intermediate sheet 22 is to be brought in contact with a photosensitive pressure-sensitive paper 24, three primarY color light sources 21R, 21G, 21B for exposure purpose, a storage box 27 for storing a stack of developer sheets 26, and a pressure developing unit 28 for placing the individual developer sheet 26 over the photosensitive pressure-sensitive paper 24 under pressure to form a visible image on the developer sheet 26 according to a latent image on the photosensitive pressure-sensitive paper 24.

Each of the developer sheets 26 is coated with a developer material, while the photosensitive pressure-sensitive paper 24 is coated at one surface with a chromogenic material or color former contained in uncured microcapsules. When the microcapsules on the photosensitive pressure-sensitive paper 24 are ruptured as the photosensitive pressure-sensitive paper 24 together with the developer sheet 26 is pressed by the pressure developing unit 28, the developer material on the developer sheet 26 reacts with the chromogenic material on the photosensitive pressure-sensitive paper 24 to take on color.

The apparatus 20 also includes a thermal fixing unit 29 which serves to assist in coloring, a discharge tray 30 for receiving the sheet (24) on which a visible color image is formed, an insertion tray 31 from which the intermediate sheet 22 is to be introduced into the apparatus 20 by hand, another discharge tray 32 for receiving the exposed intermediate sheet, and another insertion tray 33 from which the developer sheet 26 is to be introduced into the apparatus 20 by hand.

Figure 2:
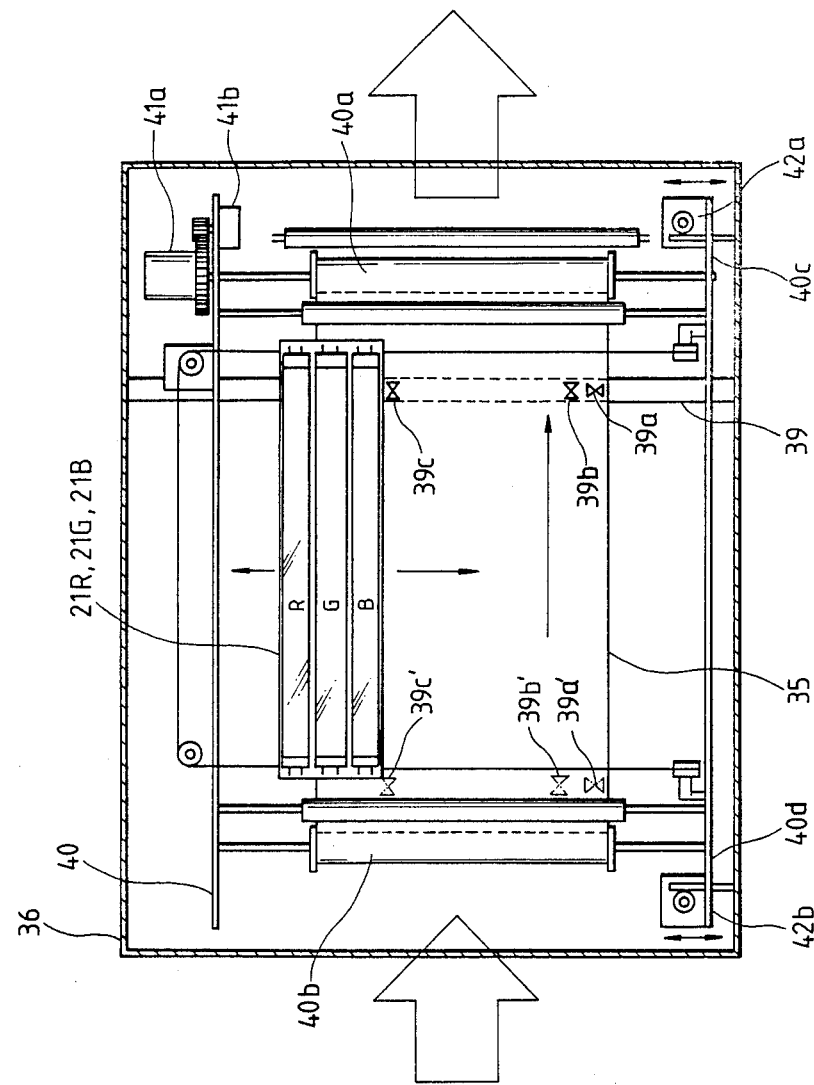
FIG. 2 is a plan view, with parts broken away, of FIG. 1, showing an exposure unit.

As shown in FIG. 2, the exposure unit 36 includes a sensor holder 39 fixed to an unnumbered frame of the exposure unit 36, a reflection-type optical sensor 39a mounted on the sensor holder 39 for reading out a location mark (described below) with respect to both a direction (hereinafter referred to as "longitudinal direction") of travelling of the intermediate sheet 22 and a direction (hereinafter referred to as "transverse direction") substantially perpendicular to the longitudinal direction, and two other reflection-type Optical sensors 39b, 39c mounted on the sensor holder 39 for reading out the location mark only with respect to the longitudinal direction.

The exposure unit 36 also includes a belt support unit 40 supporting the conveyor belt 35 via a pair of rollers 40a, 40b, a first motor 41a rotatable at a high speed for making a coarse movement of the conveyor belt 35, a second motor 41b operatively connected with the first motor 41a for turning the first motor 41a through a small angle so as to make a fine movement of the conveyor belt 35, and a pair of third and fourth motors 42a, 42b operatively connected to a pair of downstream and upstream portions 40c, 40d of the belt support unit 40 for independently and respectively moving the downstream and upstream portions 40c, 40d in the transverse direction, i.e. in a direction substantially perpendicular to the travelling path of the conveyor belt 35. The downstream and upstream portions 40c, 40d of the belt support unit 40 are spaced from each other in a direction parallel to the travelling path of the conveyor belt 35.

Figure 3:
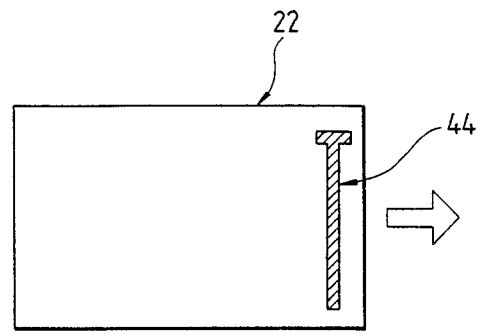
FIG. 3 is a plan view of a masking master plate to be used with the apparatus.

As shown in FIG. 3, a generally T-shaped location mark 44 to be read out by the sensors 39a, 39b, 39c is printed on an undersurface of the individual intermediate sheet 22 adjacent to a leading edge thereof. In case reflection-type optical sensors are used as in the illustrated embodiment, the width of each arm of the location mark 44 should be preferably at least 5 mm.

For the color mode, first of all one masking master plate 22R among three masking master plates 22R, 22G, 22B produced by the laser printer 1 is fed to the exposure unit 36 via the path change-over unit 10, and then a leading edge of the masking master plate 22R is located by a pair of locating rollers 34. Subsequently the masking master plate 22R is conveyed into the exposure unit 36 as the same plate is electrostatically attracted or stuck to the conveyor belt 35, in the form of an endless transparent insulating strip (e.g. a PET film). by means of the static electricity generator 3B such as a oorotoron. At that time, the conveyor belt 35 is moved forwardly in the longitudinal direction by driving the first motor 41a in which the first motor 41a is coupled to the second motor 41b through threading engagements of gears mounted on the respective rotary shafts.

The arrangement of the first and the second motors 41a, 41b can be modified in various way. For example, the rotary shaft of the first motor 41a may be directly connected to the shaft of the roller 40a and the first motor be coaxially mounted on a first gear having a large number of threads on the outer periphery thereof. The second motor 41a is mounted on the belt support unit 40 and the shaft of the second motor 41a extending through the belt support unit 40 is coaxially secured to a second gear having a small number of threads on &he outer periphery thereof. The first and second gears are threateningly engaged with each other. In one possible arrangement, the first motor 41a is disposed inside the belt support unit 40 and the second motor 41b outside the belt support unit 40. In another possible arrangement, the first motor 41a is disposed outside the belt support unit 40 and the second motor 41b inside that unit 40. In the former arrangement, only the rotary shaft of the second motor 41b passes through the side wall of the belst support unit 40. In the latter arrangement, the rotary shafts of both the first and second motors 41a and 41b pass therethrough. In operation, when the first motor 41a is actuated and the second motor 41b remains deactuated, the roller 40a is rotated at a high speed, thereby coarsely moving the conveyor belt 35. On the other hand, when the second motor 41b is actuated and the first motor 41a remains deactuated, the roller 40a is rotated at a lower speed due to reduction of the rotational speed by the threading engagement of the first and second gears, thereby finely moving the conveyor belt 35.

Figure 4:
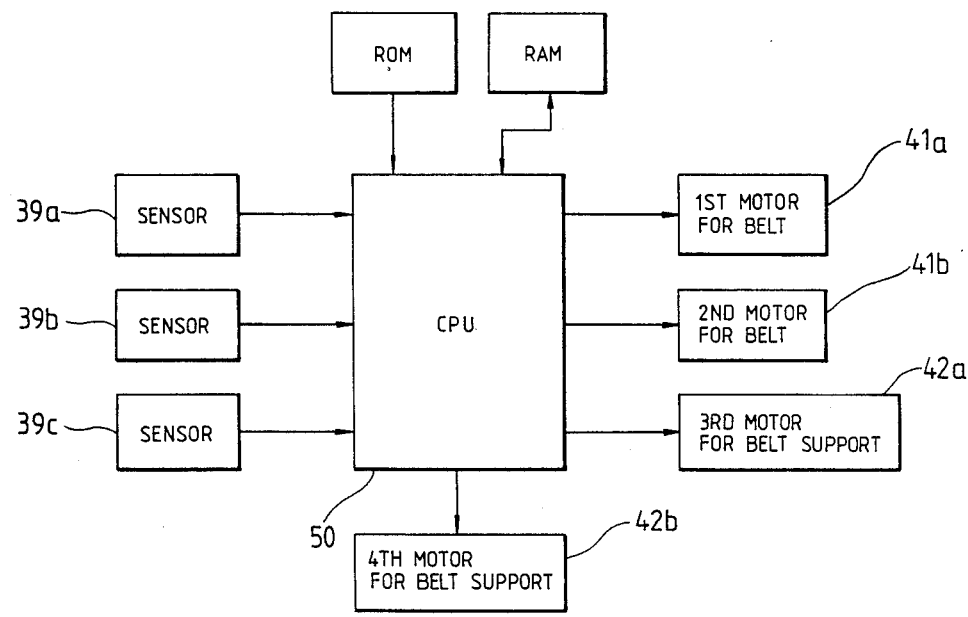
FIG. 4 is a block diagram illustrating an electrical system of locating a masking master plate.

As the location mark 44 on the masking master plate 2R conveyed into the exposure unit 36 is detected by at least one of the sensors 39a, 39b, 39c, an output signal or signals are issued from the sensor or sensors 39a, 39b, 39c and are calculated by a microcomputer 50 (FIG. 4). According to the result of this calculation, at least one of the first motor 41a, the second motor 41b, the third motor 42a and the fourth motor 42b is controlled to move the conveyor belt 35 and/or the belt support unit 40. SpecificallY, anY deviation or deflection of the masking master plate 22R in the longitudinal direction is corrected by the first and second motors 41a, 41b, while any deviation or deflection of the same masking master plate 22R in the transverse direction is corrected by the third and fourth motors 42a, 42b. At that time, any skew or slant of the masking master plate 22R also is corrected by moving the downstream and upstream portions 40c, 40d of the belt support unit 40 relative to each other portion by the third and/or fourth motors 42a, 42b. As a result, the location mark 44 on &he masking master plate 22R and hence a picture image on the same plate are registered respectively in specified positions with maximum precision.

In the exposure unit 36, the photosensitive pressure-sensitive paper 24 is brought in contact with the thus correctly positioned masking master plate 22R by the exposure stand 25 and is exposed to light from the light source 21R thrOugh the same masking master plate 22R. A color latent image corresponding to the masking master plate 22R is thereby formed on the photosensitive pressure-sensitive paper 24. After the exposing, the masking master plate 22R is discharged onto the discharge tray 32.

In like manner, a color latent image corresponding to each of the other masking master plates 22G, 22B is formed on the respective photosensitive pressure-sensitive paper 24.

For developing, the exposed photosensitive pressure-sensitive paper 24 is placed over the developer sheet 26 under pressure by the pressure developing unit 28. After this developing, the developer sheet 26 is discharged onto the discharge tray 30 via the heat fixing unit 29. Meanwhile, the used photosensitive pressure-sensitive paper 24 is wound around a take-up reel 37.

With the foregoing arrangement, since according to the position of the location mark on the masking master plate relative to the sensors, the first and second motors and the third and fourth motors are controlled so as to move the conveyor belt in the longitudinal direction and so as to move the upstream and downstream portions of the belt support unit in the transverse direction, it is possible to correct not just any deviations of the masking master plate in the longitudinal and/or transverse directions but also any skew or slant of the same plate, thus registering a picture image on the masking master plate in specified position with precision. Consequently a good quality picture image can be guaranteed.

In the foregoing embodiment, although the location mark per se can be registered in a specified position, a potential problem in case there could be a deviation in distance between the mark and the picture image is not considered. This is, when the masking master plate is produced with inadequate accuracy, a shift or deviation in portions of the picture image remote from the location mark would stand out clearly from others. For example, in case a laser printer is used for production of the masking master plate, the degree of positional precision of the dots in a transverse direction (i.e. direction of main scanning) depends on the rotational precision of a polygon mirror and the precision of an optical system, and the degree of positional precision of &he dOts in a longitudinal direction (i.e. direction of subscanning) depends on the rotational precision of a photosensitive drum and the precision of feed of a paper. Partly because the polygon mirror rotates at a high speed, and partly because the optical system is stationary, the dots in the transverse direction can be repeated with relatively good precision, but it is difficult to improve the degree of precision for rotation of the photo-sensitive drum and the feeding of the paper, namely the dots in the longitudinal direction can be repeated relatively inaccurately. Consequently, the farther the picture image portion is spaced from the location mark, the more clearly an image shift Or deviation in that portion stands out from others. Also in case a different type of printer such as a thermal printer or an ink-jet printer is used for production of the masking master plate, there would be the similar problem. Particularly at letters and small lines this image shift would be significant.

Figure 5A:
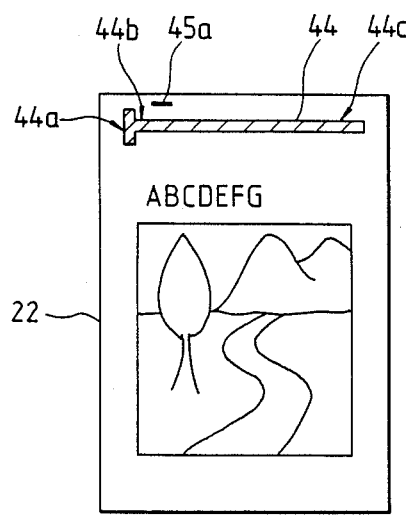
FIGS. 5A, 5B, 6 and 7 illustrate various masking master plates each having a location mark in a different position or in a different manner.

This problem can be eliminated by the following method: in the case the intermediate sheet 22 has a combined image of a half-tone image at its lower side and letters at its upper side as shown in FIG. 5A, the location mark 44 is printed on the sheet 22 adjacent to an upper or leading edge thereof., and reversely in case the letters are disposed at the lower side of the sheet 22, the location mark 44' is printed on the sheet 22 adjacent to a lower or trailing edge thereof. Each of the intermediate sheets 22 of FIGS. 6A and 5B also has an identification mark 45a, 45b in order to indicate whether the location mark 44, 44' is disposed adjacent to the upper edge or adjacent to the lower edge. The location mark, the identification mark and a combined image of a picture and letters are printed on the sheet 22 concurrently by the laser printer 1.

Figure 5B:
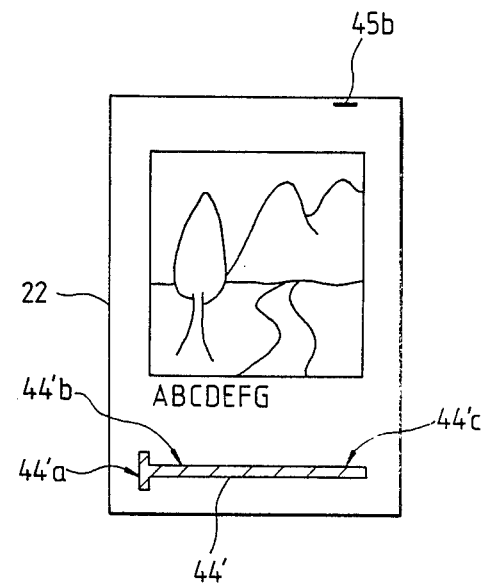

If the location mark 44 is disposed adjacent to the upper edge of the masking master plate 22R as shown in FIG. 5A, it is detected by the sensors 39a, 39b, 39c which are mounted on the sensor holder 39 as indicated by solid lines in FIGS. I and 2 Reversely, if the location mark 44' is disposed adjacent to the lower edge of the masking master plate 22R as shown in FIG. 5B, it is detected by three alternative sensors 39'a, 39'b, 39'c which are mounted on an alternative sensor holder 39' as indicated in phantom lines in FIGS. 1 and 2.

With the masking master plates of FIGS. 5A and 5B, since the location mark is disposed adjacent to the letter or character pattern, it is possible to minimize a color shift about the letters due to inaccurate printing of the three primary color master plates. Further, since the half-tone picture image is formed in a dither pattern, the area of the individual image element increases in proportion to the number of grades and therefore can give an increased degree of allowance for the color shift or deviation about contour lines. Thus, even if the half-tone picture image is remote from the location mark and hence has a large deviation, such shift does not stand out clearly. It is preferable that not only the pattern of letters but also the pattern of small lines are disposed near the location mark.

Figure 6:
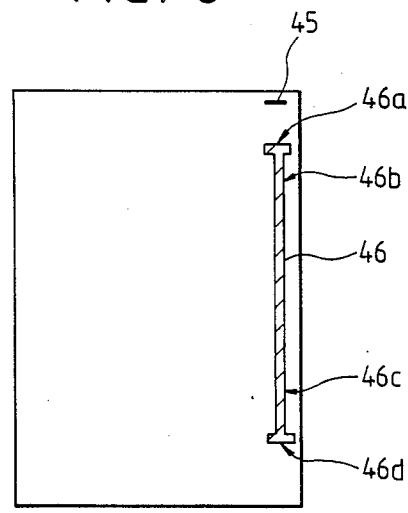

In an alternative form illustrated in FIG. 6, a generally I-shaped location mark 46 is printed on the masking master plate adjacent to one side edge of the plate, extending in the longitudinal direction. Two intermediate points 46b, 46c of the location mark 46 are detected for detecting any deviation in the transverse direction, and either of two outer points, 46a, 46b is detected for detecting any deviation in the longitudinal direction.

Figure 7:
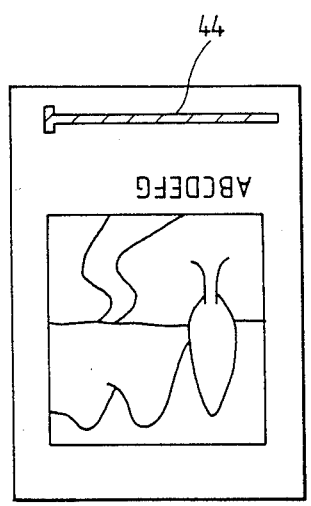

FIG. 7 illustrates another alternative form, in which with the position of the location mark 44 being kept unchanged, the picture image is turned upside down, i.e. through an angle of 180 degrees according to need, so that the pattern of letters can be disposed adjacent to the location mark 41, thus minimizing the deviation or shift. In this case, however, the picture image should be returned to its original posture afterwards.

If there is a difference in density or opaqueness between the three masking master plates 22R, 22G. 22B, correct location of the individual intermediate sheets 22 can be achieved in the following manner:

The densitY of non-image portion of the intermediate sheet 2 and also the densitY of the location mark 44 are detected bY the sensors 39b, 39c; the output or outputs of the sensors 39b, 39c are read out by the microcomputer 50 having a built-in A/D converter and are stored in RAM 51.

Figure 8C:
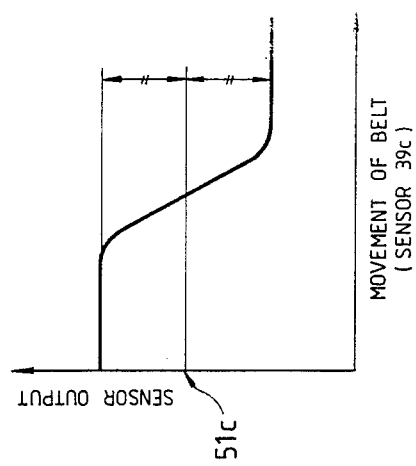
FIGS. 8A, 8B and 8C are graphs each illustrating the relation between the output of a respective one of various sensors and the movement of a conveyor belt.
Figure 8B:
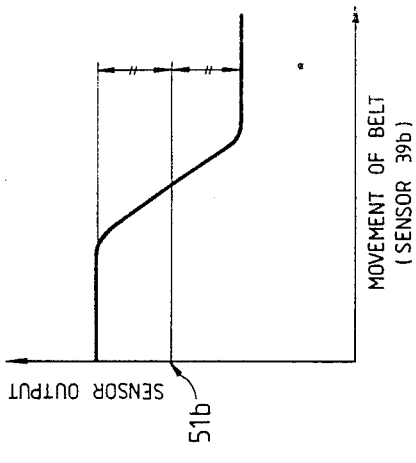
Figure 8A:
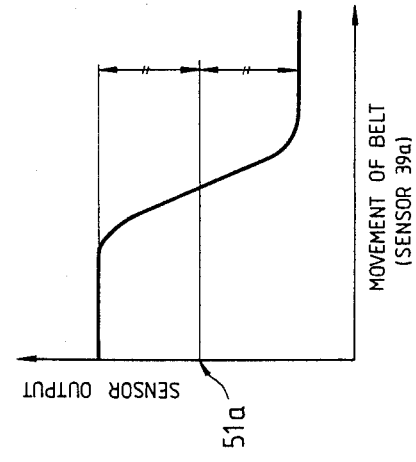

Then, as the belt support unit 40 is moved by the third and fourth motors 42a, 42b, the density of non-image portion of the intermediate sheet 22 and also the density of the location mark 44 are detected by the sensor 39a. The output of the sensor 39a is read out bY the microcomputer 50 and is stored in RAM 51 The outputs of the respective sensors 39a, 39b, 39c are shown respectively in FIGS. 8A, 8B and 8C. From the outputs of the sensors 39a, 39b, 39c, the microcomputer 50 calculates an intermediate value of the output of the respective sensor 39a, 39b, 39c corresponding to the density of non-image portion of the intermediate sheet 22 and to the density Of the location mark 44, as a threshold 51a, 51b, 51c of the respective sensors 39a, 39b, 39c. Based on the result of comparison of the output of the respective sensor 39a, 39b, 39c with the corresponding threshold 51a, 51b, 51c, the first, second, third and fourth motors 41a, 41b, 42a, 42b are controlled. Consequently it is possible to register the location mark in a specified position with precision, even if there is a difference in density between the location marks on the individual masking master plates 22R, 22G, 22B.

Figure 9:
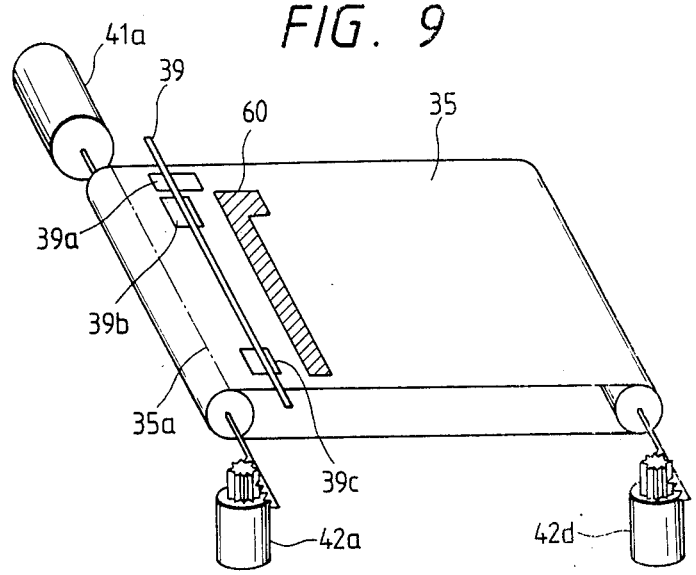
FIG. 9 is a perspective view of a modified system of locating a masking master plate.
Figure 10:
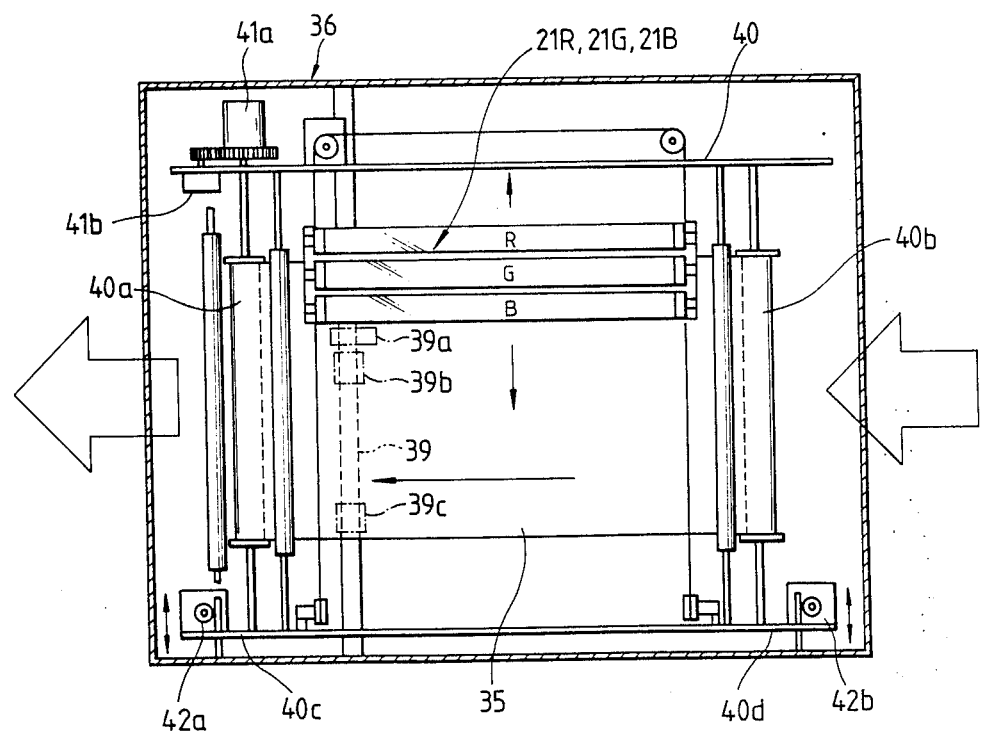
FIG. 10 is a view similar to FIG. 2, illustrating a modified exposure unit provided with the locating system of FIG. 9.

In still another embodiment shown in FIGS. 9 and 10, the intermediate-sheet locating system per se can be positioned in its initial reference position. A reference mark 60 (FIG. 9) is provided on the conveyor belt 35 at or adjacent to a joint 35a thereof and is in the shape of a generally inverted L so as to be detected bY the three location sensors 39a, 39b, 39c. That is, these location sensors 39a, 39b, 39c for detection of the location mark 44 are used also for detection of the reference mark 60.

Specifically, the conveyor belt 35 is moved forwardly in the longitudinal direction by rotating the first motor 41a in a state free from the second motor 41b. When the reference mark 60 arrives at a position immediately under the sensor holder 39, the two sensors 39b, 39c respectively read out the reference mark 60 at two spaced portions thereof and each sensor issues an output signal, whereupon the forward moving of the conveyor belt 35 by the first or high-speed motor 41a is stopped. According to the output signals from the two sensors 39b, 39c, if the conveyor belt 35 is still deviated or deflected from its original reference position, such positional error in the longitudinal direction is corrected by moving the conveyor belt 35 in the longitudinal direction by the second or low-speed motor 41b.

Then the downstream portion 40c of the belt support unit 40 (FIG. is moved by the third motor 42a in the transverse direction until the reference mark 60 is detected by the sensor 39a. According to the output signal from the sensor 39a, if the belt support unit 40 at its upstream portion 42c is deviated or deflected from the original reference position, such positional error in the transverse direction is corrected by moving the upstream portion 42c of the belt support unit 40 in the transverse direction by the third motor 42a.

Further, if the belt support unit 40 is slanted or inclined with respect to the original reference position, such skew is corrected bY moving the upstream portion 40d of the belt support unit 40 in the transverse direction by the fourth motor 42b until the difference between the outputs of the two sensors 39b, 39c will be zero. Thus the conveyor belt 35 has been set in its original reference position. If the first motor 41a is rotatable with an adequately high degree of precision, the second motor 41b may be omitted.

With this arrangement, since the same sensors and motors of the system for location of the masking master plate can be used also for positioning such location system in its original reference position, no additional part but only a simple reference mark on the conveyor belt is required for this purpose.

Many other modifications and variations of the present invention are possible in the light of the foregoing teachings. It is therefore to be understood that within the scope of the appended claims, the invention may be practiced otherwise than as specifically described.

For example, the monochromatic printer is not limited to the laser printer 1 and may be any other type such as an LED printer, a liquid crystal printer or a thermal-transfer printer provided that it can produce trichromatic (red. green, blue) resolution originals. Further, a desktop printer may be mounted on the top of the apparatus 20 and is operatively coupled therewith. If a separate large-sized printer is used, trichromatic resolution originals produced by the printer may be supplied into the apparatus 20 via the insertion tray 31.

In the illustrated embodiments the transfer type recording medium is used, and coldor forming takes place in combination of the photosensitive pressure-sensitive paper 24 and the developer sheet 26. Alternatively the self-contained type recording medium, which has the functions of both the photosensitive pressure-sensitive paper and the developer sheet, may be used.

Further, the third and fourth motors 42a, 42b may be mounted on the exposure unit 36 rather than the belt support unit 40 and may be operatively connected to a cam or an arm of a link to push the belt support unit 40.

The first and second motors 41a, 41b, which have the separate functions to move the conveyor belt 35 respectively in a coarse fashion and in a fine fashion, may be replaced with a single motor having a combined function for both coarse and fine adjustments of the conveyor belt 35.

Each of the sensors 39a, 39b, 39c is not limited to a reflection-type optical sensor but may be anY other type such as a transmission type.

The location mark to be printed on each masking master plate may have any shape other than the illustrated particular shape, i.e. a generally T shape. However, the location mark should be such that it can be read out by the sensors 39a, 39b, 39c. The location mark also should be printed in a precise position with respect to the position of the picture image formed on the masking master plate.

Further, the conveyor belt 35 is not limited to an endless belt and may be any other form, e.g. an elongated strip of belt having a pair of opposite ends rolled round a pair of rollers, respectively.

Although in the illustrated embodiments, the control means for various motors has the assistance of software using the microcomputer 50, the control means may be composed of only hardware, i.e. electrical circuits.

Moreover, in the illustrated embodiments, a set of three masking master plates respectively corresponding to three primary colors, i.e. red, green and blue, is used. It should be understood that the colors and the number of color resolution plates are not restricted to the illustrated particular examples. For example, a black-and-white plate may be used in addition to these three masking master plates for three primary colors.

What is claimed is:

1. A color picture image recording apparatus for forming a color picture image on a photosensitive recording medium by exposing the photosensitive recording medium to light through each of a plurality of masking master plates produced according to original color picture image information, each of the masking master plates having a location mark, said apparatus comprising:
   (a) a housing;
   (b) a conveyor belt disposed in said housing and defining a flat surface for carrying thereon one of the masking master plates at a time, said flat surface having a downstream end and an upstream end;
   (c) a belt support unit mounted in said housing and supporting said conveyor belt, said belt support unit being movable relative to said housing and having a pair of downstream and upstream portions;
   (d) first drive means for moving said conveyor belt in a longitudinal direction;
   (e) second and third drive means operatively connected to said belt support unit at said downstream and upstream portions, respectively, each of said second and third drive means being independently operable for moving a respective one of said downstream and upstream portions in a plane parallel to said flat surface of said conveyor belt and in a transverse direction substantially perpendicular to said longitudinal direction;
   (f) a plurality of sensors disposed above said flat surface of said conveyor belt for reading out said location mark on the individual masking master plate carried on said flat surface of said conveyor belt and for issuing respective output signals; and
   (g) control means for controlling said first, second and third drive means according to the output signals issued from said sensors.

2. A color picture image recording apparatus according to claim 1, wherein said first drive means is drivable at a speed selected from a high speed and a low speed.

3. A color picture image recording apparatus according to claim 2, wherein said first drive means includes a first motor, and a second motor adapted to be selectively connected with and disconnected from said first motor, said first motor being rotatable at the high speed when said second motor is disconnected from said first motor, said first motor being rotatable at the low speed when said second motor is connected with said first motor.

4. A color picture image recording apparatus according to claim 3, wherein said belt support unit includes a pair of rollers about which said conveyor belt is wound, one of said rollers being operatively connected to said first drive mean for rotation.

5. A color picture image recording apparatus according to claim wherein said second and third drive means respectively include a third motor mounted on said belt support unit at a position adjacent to said downstream portion, and a fourth motor mounted on said belt support unit at a position adjacent to said upstream portion.

6. A color picture image recording apparatus according to claim I, wherein said sensors are disposed adjacent to said downstream end of said flat surface of said conveyor belt.

7. A color picture image recording apparatus according to claim I, wherein said sensors are disposed adjacent to said upstream end of said flat surface of said conveyor belt.

8. A color picture image recording apparatus according to claim 6, wherein said each masking master plate has a pair of upper and lower edges and a pair of opposed side edges, said location mark being disposed adjacent to said upper edge of said each masking master plate.

9. A color picture image recording apparatus according to claim 7, wherein said each masking master plate has a pair of upper and lower edges and a pair of opposed side edges, said location mark being disposed adjacent to said lower edge of said each masking master plate.

10. A color picture image recording apparatus according to claim 1, wherein said each masking master plate has a pair of upper and lower edges and a pair of opposed side edges, said location mark being disposed adjacent to one of said side edges.

11. A color picture image recording apparatus according to claim 8, wherein said location mark of said each masking master plate has a generally T shape.

12. A color picture image recording apparatus according to claim 9, wherein said location mark of said each masking master plate has a generally T shape.

13. A color picture image recording apparatus according to claim further including a sensor holder mounted in said housing and extending over said conveyor belt, said sensors being mounted on said sensor holder and being spaced from one another along said sensor holder.

14. A color picture image recording apparatus according to claim 1, wherein said each masking master plate has a combined image including a half-tone picture image and a pattern of small lines, said location mark being disposed adjacent to said pattern of small lines.

15. A color picture image recording apparatus according to claim I, wherein said each masking master plate has a non-image area having a first density, said location mark having a second densitY different from said first density.

16. A color picture image recording apparatus according to claim 15, wherein each of said sensors has a function of reading out both said first density and said second density and issuing a pair of output signals corresponding to said first density and said second density, said control means has a function of calculating an intermediate value from said output signals from said each sensor and determining said intermediate value as a threshold for said each sensor.

17. A color picture image recording apparatus according to claim wherein said control means includes a microcomputer for reading out said output signals from said each sensor and a RAM for storing said output signals, said microcomputer also having a function of comparing said output signals with said threshold.

18. A color picture image recording apparatus according to claim 8, wherein said each masking master plate has an identification mark indicating whether said locating mark is disposed adjacent to said upper edge of said each masking master plate or adjacent to said lower edge of said each masking master plate. master plate.

19. A color picture image recording apparatus according to claim 9, wherein said each masking master plate has an identification mark indicating whether said location mark is disposed adjacent to said upper edge of said each masking master plate or adjacent to said lower edge of said each masking master plate.

20. A color picture image recording apparatus for forming a color picture image on a photosensitive recording medium by exposing the photosensitive recording medium to light through each of a plurality of masking master plates produced according to original color picture image information, said apparatus comprising:
  (a) a housing;
  (b) a conveyor belt disposed in said housing for carrying thereon one of the masking master plates at a time, said conveyor belt being initially disposed in a reference position and having a reference mark thereon;
  (c) a belt support unit mounted in said housing and supporting said conveyor belt, said belt support unit being movable relative to said housing;
  (d) first drive means for moving said conveyor belt in a longitudinal direction;
  (e) second drive means for moving said conveyor belt in a transverse direction substantially perpendicular to the longitudinal direction;
  (f) a plurality of sensors disposed above said conveyor belt for reading out said reference mark on said conveyor belt and issuing a reference signal; and
  (g) control means for controlling said first and said second drive means according to the reference signal issued from said sensors to dispose said conveyor belt in the reference position.

21. A color picture image recording apparatus according to claim 20, wherein said reference mark is of generally inverted L-shape.

* * * * *